United States Patent
Wagner

(10) Patent No.: US 8,617,301 B2
(45) Date of Patent: Dec. 31, 2013

(54) COMPOSITIONS AND METHODS FOR FORMING AND DEPOSITING METAL FILMS ON SEMICONDUCTOR SUBSTRATES USING SUPERCRITICAL SOLVENTS

(75) Inventor: Mark Ian Wagner, Austin, TX (US)

(73) Assignee: Lam Research Corporation, Fremont, CA (US)

( * ) Notice: Subject to any disclaimer, the term of this patent is extended or adjusted under 35 U.S.C. 154(b) by 532 days.

(21) Appl. No.: 11/699,487

(22) Filed: Jan. 30, 2007

(65) Prior Publication Data
US 2008/0213999 A1    Sep. 4, 2008

(51) Int. Cl.
| | |
|---|---|
| B22F 7/00 | (2006.01) |
| C09D 5/00 | (2006.01) |
| C09D 5/10 | (2006.01) |
| C23C 16/00 | (2006.01) |
| C23C 18/00 | (2006.01) |
| C23C 18/44 | (2006.01) |
| C23C 20/00 | (2006.01) |

(52) U.S. Cl.
USPC ....... 106/1.05; 106/1.12; 106/1.13; 106/1.14; 106/1.15; 106/1.18; 106/1.19; 106/1.21; 106/1.22; 106/1.23; 106/1.24; 106/1.25; 106/1.26; 106/1.27; 106/1.28; 106/1.29; 427/585; 427/123; 427/124; 427/126.1

(58) Field of Classification Search
USPC ............... 252/512–515; 106/1.05, 1.12, 1.13, 106/1.15–18, 1.22, 1.23, 1.25–27; 427/585, 427/123–125, 126.1, 248.1, 250, 255.11, 427/255.28; 438/584
See application file for complete search history.

(56) References Cited

U.S. PATENT DOCUMENTS

| | | |
|---|---|---|
| 5,324,341 A | 6/1994 | Nagel et al. |
| 5,789,027 A | 8/1998 | Watkins et al. |
| 6,277,203 B1 | 8/2001 | Jiang et al. |
| 6,323,121 B1 | 11/2001 | Liu et al. |
| 6,337,277 B1 | 1/2002 | Chou et al. |
| 6,457,477 B1 | 10/2002 | Young et al. |
| 6,486,078 B1 | 11/2002 | Rangarajan et al. |
| 6,561,220 B2 | 5/2003 | McCullough et al. |
| 6,596,344 B2 | 7/2003 | Zhuang et al. |
| 6,620,733 B2 | 9/2003 | Ho |
| 6,689,700 B1 | 2/2004 | Watkins et al. |
| 6,736,149 B2 | 5/2004 | Biberger et al. |
| 6,777,344 B2 | 8/2004 | Annapragada et al. |
| 6,841,483 B2 | 1/2005 | Zhu et al. |
| 6,893,969 B2 | 5/2005 | Ho et al. |
| 6,909,195 B2 | 6/2005 | Li et al. |
| 6,949,411 B1 | 9/2005 | Mikhaylichenko et al. |
| 6,992,018 B2 | 1/2006 | Watkins et al. |
| 7,030,168 B2 | 4/2006 | Xu et al. |
| 7,049,226 B2 | 5/2006 | Chung et al. |
| 7,119,418 B2 | 10/2006 | Xu et al. |
| 2003/0124785 A1* | 7/2003 | Xu et al. ......... 438/200 |
| 2003/0222018 A1* | 12/2003 | Yonker et al. ......... 210/634 |
| 2004/0023453 A1* | 2/2004 | Xu et al. ......... 438/202 |
| 2004/0187792 A1 | 9/2004 | Parks |
| 2005/0026430 A1 | 2/2005 | Kim et al. |
| 2005/0181613 A1 | 8/2005 | Xu et al. |
| 2005/0209095 A1* | 9/2005 | Brown ......... 502/150 |
| 2005/0230351 A1 | 10/2005 | Tahara |
| 2005/0279381 A1 | 12/2005 | Masuda et al. |
| 2006/0099343 A1 | 5/2006 | Thompson et al. |
| 2006/0102895 A1 | 5/2006 | Hendrix et al. |
| 2006/0223312 A1 | 10/2006 | Yonker et al. |
| 2007/0128864 A1* | 6/2007 | Ma et al. ......... 438/680 |

FOREIGN PATENT DOCUMENTS

| | | |
|---|---|---|
| KR | 10-1999-0050454 A | 11/1999 |
| KR | 10-1999-0051856 A | 11/1999 |
| KR | 10-2004-0110672 A | 12/2004 |
| WO | WO 2007/000186 A1 | 1/2007 |

OTHER PUBLICATIONS

Collman, et al, "*Principles and Applications of Organotransition Metal Chemistry*", University Science Books, 1987, pp. 24-29, University Science Books, Mill Valley, California.
International Search Report and Written Opinion for PCT/US2008/000986 dated Jun. 16, 2008.
Co-pending U.S. Appl. No. 12/010,542, filed Jan. 25, 2008, entitled Composition and Methods for Forming Metal Films on Semiconductor Substrates Using Supercritical Solvents.
International Preliminary Report on Patentability mailed Aug. 4, 2009 for PCT/US2008/001074.
Written Opinion mailed Sep. 27, 2010 for Singapore Patent Appln. No. 200905044-4.
Official Action issued on May 26, 2011 by the Singapore Patent Office in corresponding Singaporean Patent Application No. 0905044-4.

* cited by examiner

*Primary Examiner* — Basia Ridley
*Assistant Examiner* — Heng Chan
(74) *Attorney, Agent, or Firm* — Buchanan Ingersoll & Rooney PC

(57) ABSTRACT

Compositions and methods for depositing elemental metal M(0) films on semiconductor substrates are disclosed. One of the disclosed methods comprises: heating the semiconductor substrate to obtain a heated semiconductor substrate; exposing the heated semiconductor substrate to a composition containing a metal precursor, an excess amount of neutral labile ligands, and a supercritical solvent; exposing the metal precursor to a reducing agent and/or thermal energy at or near the heated semiconductor substrate; reducing the metal precursor to the elemental metal M(0) by using the reducing agent and/or the thermal energy; and depositing the elemental metal M(0) film while minimizing formation of metal oxides.

20 Claims, No Drawings

COMPOSITIONS AND METHODS FOR FORMING AND DEPOSITING METAL FILMS ON SEMICONDUCTOR SUBSTRATES USING SUPERCRITICAL SOLVENTS

BACKGROUND

In the field of semiconductor manufacturing, deposition of materials such as elemental metals having a formal oxidation state which equals to zero ("M(0)") on semiconductor substrates can be carried out by a variety of techniques, including chemical vapor deposition ("CVD"), physical vapor deposition ("PVD"), and atomic layer deposition ("ALD").

Conventional CVD processes for metal film deposition occurs through the volatilization of metal precursors at high temperatures under vacuum. The selection of metal precursors available for CVD is limited by requirements such as high thermal stability and sufficient volatility of the metal precursors. When a precursor is selected and volatilized during the CVD process, the metal precursor is usually only present in the vapor at low concentrations. This can lead to limited film growth resulting in non-conformal films. Moreover, the high temperature requirements of CVD can significantly impact the thermal budget during wafer processing.

With regard to conventional PVD of metal precursors, PVD is fundamentally limited by the nature of a line-of-sight deposition process that results in non-conformal film growth and inability to deposit material in certain types of high aspect ratio structures. Additional shortcomings of PVD include the significant particle levels that are generated in the PVD process, limited control and lack of homogeneity of the deposited film, and process control issues relating to diffusion of the sputtered material.

Conventional ALD processes for deposition of thin films occurs through exposure of the substrate to alternating cycles of precursors to grow atomically thin films. While the ability to grow films in a carefully controlled manner at the atomic level results in conformal deposition, the high number of cycles required to prepare even very thin films leads to slow film growth. Moreover, repetitive valve cycling can also lead to particle generation and maintenance issues.

Currently, several integrated circuit ("IC") processes require low cost deposition of conformal thin-films for both front end of line and back end of line applications, including capacitor electrodes, barriers, and interconnects.

Some of the limitations of conventional CVD, PVD, and ALD techniques described above suggest a need in the art for improved methods of depositing metal(s) on semiconductor substrates.

SUMMARY

According to a first embodiment, a composition for forming and depositing M(0) films on semiconductor substrates is disclosed. The composition comprising: at least one metal precursor; neutral labile ligands; and at least one supercritical solvent.

The composition of the first embodiment can further comprise (i) at least one reducing agent, and/or (ii) at least one co-solvent.

The reducing agent can be selected from the group consisting of zinc, magnesium, cadmium, mercury, sodium, potassium, lithium, boron, aluminum, and alloys thereof. In other embodiments, the reducing agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reducing agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reducing agent can be hydrogen.

The co-solvent can be selected from the group consisting of alcohols, ketones, amines, esters, ethers, lactones, carbonates, alkanes, arenes, heterocyclics, amides, and mixtures thereof. In other embodiments, the co-solvent can be selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof.

The metal precursor of the first embodiment can be present in the composition in a range of from about 0.001 to about 20% by weight. The supercritical solvent can be present in the composition in a range of from about 10% to about 99.9% by weight. The composition of the first embodiment can be surfactant-free.

The metal precursor of the first embodiment can comprise transition metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, mercury, and mixtures thereof. More preferably, the metal precursor can comprise transition metals selected from the group consisting of titanium, zirconium, hafnium, vanadium, tantalum, chromium, molybdenum, tungsten, manganese, iron, cobalt, nickel, palladium, platinum, copper, silver, gold, zinc, cadmium, mercury, and mixtures thereof. Most preferably, the metal precursor can comprise transition metals selected from the group consisting of tantalum, hafnium, zirconium, titanium, tungsten, molybdenum, chromium, and mixtures thereof.

The neutral labile ligands according to the first embodiment can be present in a ratio of at least about 10:1 of moles of neutral labile ligands to moles of the metal precursor. More preferably, the neutral labile ligands can be present in a ratio of at least about 100:1 of moles of neutral labile ligands to moles of the metal precursor. Most preferably, the neutral labile ligands can be present in a ratio of at least about 1000:1 of moles of neutral labile ligands to moles of the metal precursor.

The neutral labile ligands according to the first embodiment can be selected from the group consisting of ethers, nitriles, thioethers, alkenes, alkynes, acyclic dienes, arenes, aromatics, ketones, amines, phosphines, isocyanides, isonitriles, CO, dinitrogen, and mixtures thereof. In other embodiments, the neutral labile ligands can be selected from the group consisting of CO, acetonitrile, tetrahydrofuran, ethyl ether, triethylamine, triphenyl phosphine, ethylene, butadiene, 4-heptanone, and mixtures thereof. In preferred embodiments, the neutral labile ligands can be selected from the group consisting of CO, acetonitrile, tetrahydrofuran, ether, and mixtures thereof.

The supercritical solvent according to the first embodiment can be selected from the group consisting of carbon dioxide, oxygen, argon, krypton, xenon, ammonia, methane, methanol, dimethyl ketone, a hydrogen forming gas, sulfur hexafluoride, and mixtures thereof.

The metal in the metal precursor of the first embodiment can have an oxidation state that is lower than the thermodynamically favored oxidation state of the metal.

The elemental metal M(0) film in the first embodiment can comprise one or more elemental metals. In other embodiments, one or more layers of the elemental metal M(0) film can be deposited.

According to a second embodiment, a composition for forming and depositing M(0) films on semiconductor substrates is disclosed. The composition comprising: at least one metal precursor, wherein the metal in the metal precursor has a first oxidation state which is a thermodynamically favored oxidation state of the metal; at least one reactive agent which reacts with the at least one metal precursor forming a reacted metal precursor, wherein the metal in the reacted metal precursor has a second oxidation state, and wherein the second oxidation state is lower than the first oxidation state and is less thermodynamically favored; neutral labile ligands; and at least one supercritical solvent.

The composition according to the second embodiment can further comprise (i) at least one reducing agent, (ii) at least one co-solvent, and/or (iii) at least one acid scavenger.

The reducing agent can be selected from the group consisting of zinc, magnesium, cadmium, mercury, sodium, potassium, lithium, boron, aluminum, and alloys thereof. In other embodiments, the reducing agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reducing agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reducing agent can be hydrogen.

In some embodiments, the reducing agent can be the same as the reactive agent.

The co-solvent can be selected from the group consisting of alcohols, ketones, amines, esters, ethers, lactones, carbonates, alkanes, arenes, heterocyclics, amides, and mixtures thereof. In other embodiments, the co-solvent can be selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof.

The acid scavenger can be selected from the group consisting of pyridine, pyridine derivatives, heterocyclic compounds, amines, alkenes, silanes, carboxylate salts, lead salts, lead oxides, magnesium oxides, aluminum oxides, zinc oxides, hydrotalcites, and mixtures thereof. In some embodiments, the acid scavenger can be selected from the group consisting of pyridine, alkyl substituted pyridines, and mixtures thereof. In preferred embodiments, the acid scavenger can be selected from the group consisting of pyridine, C1-C6 alkyl substituted pyridine derivatives, and mixtures thereof.

The at least one metal precursor of the second embodiment can be present in a range of from about 0.001 to about 20% by weight. The supercritical solvent can be present in a range of from about 10% to about 99.9% by weight. The composition of the second embodiment can be surfactant-free.

The at least one metal precursor of the second embodiment can comprise transition metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, mercury, and mixtures thereof. More preferably, the metal precursor can comprise transition metals selected from the group consisting of titanium, zirconium, hafnium, vanadium, tantalum, chromium, molybdenum, tungsten, manganese, iron, cobalt, nickel, palladium, platinum, copper, silver, gold, zinc, cadmium, mercury, and mixtures thereof. Most preferably, the metal precursor can comprise transition metals selected from the group consisting of tantalum, hafnium, zirconium, titanium, tungsten, molybdenum, chromium, and mixtures thereof.

The neutral labile ligands according to the second embodiment can be present in a ratio of at least about 10:1 of moles of neutral labile ligands to moles of the metal precursor. More preferably, the neutral labile ligands can be present in a ratio of at least about 100:1 of moles of neutral labile ligands to moles of the metal precursor. Most preferably, the neutral labile ligands can be present in a ratio of at least about 1000:1 of moles of neutral labile ligands to moles of the metal precursor.

The neutral labile ligands according to the second embodiment can be selected from the group consisting of ethers, nitriles, thioethers, alkenes, alkynes, acyclic dienes, arenes, aromatics, ketones, amines, phosphines, isocyanides, isonitriles, CO, dinitrogen, and mixtures thereof. In other embodiments, the neutral labile ligands can be selected from the group consisting of CO, acetonitrile, tetrahydrofuran, ethyl ether, triethylamine, triphenyl phosphine, ethylene, butadiene, 4-heptanone, and mixtures thereof. In preferred embodiments, the neutral labile ligands are selected from the group consisting of CO, acetonitrile, tetrahydrofuran, ether, and mixtures thereof.

The supercritical solvent according to the second embodiment can be selected from the group consisting of carbon dioxide, oxygen, argon, krypton, xenon, ammonia, methane, methanol, dimethyl ketone, a hydrogen forming gas, sulfur hexafluoride, and mixtures thereof.

The reactive agent according to the second embodiment can be selected from the group consisting of zinc, magnesium, cadmium, mercury, sodium, potassium, lithium, boron, aluminum, and alloys thereof. In other embodiments, the reactive agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reactive agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reactive agent can be hydrogen.

The elemental metal M(0) film in the second embodiment can comprise one or more elemental metals. In other embodiments, one or more layers of the elemental metal M(0) film can be deposited.

According to a third embodiment, a method for depositing an elemental metal M(0) film on a semiconductor substrate is disclosed. The method comprising: heating the semiconductor substrate to obtain a heated semiconductor substrate; exposing the heated semiconductor substrate to a composition containing at least one metal precursor, an excess amount of neutral labile ligands, and a supercritical solvent; exposing the metal precursor to a reducing agent and/or thermal energy at or near the heated semiconductor substrate; reducing the metal precursor to the elemental metal M(0) by using the reducing agent and/or the thermal energy; and depositing the elemental metal M(0) film while minimizing formation of metal oxides.

The elemental metal M(0) film in the third embodiment can comprise one or more elemental metals. In other embodiments, one or more layers of the elemental metal M(0) film can be deposited.

The composition of the third embodiment can further comprise (i) at least one reducing agent, and/or (ii) at least one co-solvent.

The reducing agent can be selected from the group consisting of zinc, magnesium, cadmium, mercury, sodium, potassium, lithium, boron, aluminum, and alloys thereof. In other embodiments, the reducing agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reducing agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reducing agent can be hydrogen.

The co-solvent can be selected from the group consisting of alcohols, ketones, amines, esters, ethers, lactones, carbonates, alkanes, arenes, heterocyclics, amides, and mixtures thereof. In other embodiments, the co-solvent can be selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof.

The metal precursor of the third embodiment can be present in a range of from about 0.001 to about 20% by weight. The supercritical solvent can be present in a range of from about 10% to about 99.9% by weight. The composition of the third embodiment can be surfactant-free.

The metal precursor of the third embodiment can comprise transition metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, mercury, and mixtures thereof. More preferably, the metal precursor can comprise transition metals selected from the group consisting of titanium, zirconium, hafnium, vanadium, tantalum, chromium, molybdenum, tungsten, manganese, iron, cobalt, nickel, palladium, platinum, copper, silver, gold, zinc, cadmium, mercury, and mixtures thereof. Most preferably, the metal precursor can comprise transition metals selected from the group consisting of tantalum, hafnium, zirconium, titanium, tungsten, molybdenum, chromium, and mixtures thereof.

The neutral labile ligands according to the third embodiment can be present in a ratio of at least about 10:1 of moles of neutral labile ligands to moles of the metal precursor. More preferably, the neutral labile ligands can be present in a ratio of at least about 100:1 of moles of neutral labile ligands to moles of the metal precursor. Most preferably, the neutral labile ligands can be present in a ratio of at least about 1000:1 of moles of neutral labile ligands to moles of the metal precursor.

The neutral labile ligands according to the third embodiment can be selected from the group consisting of ethers, nitriles, thioethers, alkenes, alkynes, acyclic dienes, arenes, aromatics, ketones, amines, phosphines, isocyanides, isonitriles, CO, dinitrogen, and mixtures thereof. In other embodiments, the neutral labile ligands can be selected from the group consisting of CO, acetonitrile, tetrahydrofuran, ethyl ether, triethylamine, triphenyl phosphine, ethylene, butadiene, 4-heptanone, and mixtures thereof. In preferred embodiments, the neutral labile ligands can be selected from the group consisting of CO, acetonitrile, tetrahydrofuran, ether, and mixtures thereof.

The supercritical solvent according to the third embodiment can be selected from the group consisting of carbon dioxide, oxygen, argon, krypton, xenon, ammonia, methane, methanol, dimethyl ketone, a hydrogen forming gas, sulfur hexafluoride, and mixtures thereof.

The supercritical solvent can be at a temperature of from about 20° C. to about 150° C.

The temperature of the semiconductor substrate can be between from about 20° C. to about 450° C.

The method according to the third embodiment can be carried out in a vessel which is pressurized from about 1000 psi to about 7000 psi.

According to a fourth embodiment, a method for depositing an elemental metal M(0) film on a semiconductor substrate is disclosed. The method comprising: exposing a first metal precursor to a reactive agent in the presence of a supercritical solvent containing an excess amount of neutral labile ligands, wherein the metal in the first metal precursor has a first oxidation state, wherein the first oxidation state is a thermodynamically favored oxidation state of the metal; forming in-situ a second metal precursor, wherein the metal in the second metal precursor has a second oxidation state, and wherein the second oxidation state is lower than the first oxidation state and is less thermodynamically favored; exposing the in-situ formed second metal precursor to a reducing agent and/or thermal energy; reducing the in-situ formed second metal precursor to the elemental metal M(0); and depositing the elemental metal M(0) film on a semiconductor substrate while minimizing formation of metal oxides.

The composition according to the fourth embodiment can further comprise (i) at least one reducing agent, (ii) at least one co-solvent, and/or (iii) at least one acid scavenger.

The reducing agent can be selected from the group consisting of zinc, magnesium, cadmium, mercury, sodium, potassium, lithium, boron, aluminum, and alloys thereof. In other embodiments, the reducing agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reducing agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reducing agent can be hydrogen.

In some embodiments, the reducing agent can be the same as the reactive agent.

The co-solvent can be selected from the group consisting of alcohols, ketones, amines, esters, ethers, lactones, carbonates, alkanes, arenes, heterocyclics, amides, and mixtures thereof. In other embodiments, the co-solvent can be selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof.

The acid scavenger can be selected from the group consisting of pyridine, pyridine derivatives, heterocyclic compounds, amines, alkenes, silanes, carboxylate salts, lead salts, lead oxides, magnesium oxides, aluminum oxides, zinc oxides, hydrotalcites, and mixtures thereof. In some embodiments, the acid scavenger can be selected from the group consisting of pyridine, alkyl substituted pyridines, and mixtures thereof. In preferred embodiments, the acid scavenger can be selected from the group consisting of pyridine, C1-C6 alkyl substituted pyridine derivatives, and mixtures thereof.

The reactive agent according to the fourth embodiment can be selected from the group consisting of zinc, magnesium, cadmium, mercury, sodium, potassium, lithium, boron, aluminum, and alloys thereof. In other embodiments, the reactive agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reactive agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reactive agent can be hydrogen.

The metal precursor of the fourth embodiment can be present in a range of from about 0.001 to about 20% by weight. The supercritical solvent can be present in a range of from about 10% to about 99.9% by weight. The composition of the fourth embodiment can be surfactant-free.

The metal precursor of the fourth embodiment can comprise transition metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, mercury, and mixtures thereof. More preferably, the metal precursor can comprise transition metals selected from the group consisting of titanium, zirconium, hafnium, vanadium, tantalum, chromium, molybdenum, tungsten, manganese, iron, cobalt, nickel, palladium, platinum, copper, silver, gold, zinc, cadmium, mercury, and mixtures thereof. Most preferably, the metal precursor comprises transition metals selected from the group consisting of tantalum, hafnium, zirconium, titanium, tungsten, molybdenum, chromium, and mixtures thereof.

The neutral labile ligands according to the fourth embodiment can be present in a ratio of at least about 10:1 of moles of neutral labile ligands to moles of the metal precursor. More preferably, the neutral labile ligands can be present in a ratio of at least about 100:1 of moles of neutral labile ligands to moles of the metal precursor. Most preferably, the neutral labile ligands can be present in a ratio of at least about 1000:1 of moles of neutral labile ligands to moles of the metal precursor.

The neutral labile ligands according to the fourth embodiment can be selected from the group consisting of ethers, nitriles, thioethers, alkenes, alkynes, acyclic dienes, arenes, aromatics, ketones, amines, phosphines, isocyanides, isonitriles, CO, dinitrogen, and mixtures thereof. In other embodiments, the neutral labile ligands can be selected from the group consisting of CO, acetonitrile, tetrahydrofuran, ethyl ether, triethylamine, triphenyl phosphine, ethylene, butadiene, 4-heptanone, and mixtures thereof. In preferred embodiments, the neutral labile ligands can be selected from the group consisting of CO, acetonitrile, tetrahydrofuran, ether, and mixtures thereof.

The elemental metal M(0) film in the fourth embodiment can comprise one or more elemental metals. In other embodiments, one or more layers of the elemental metal M(0) film can be deposited.

The supercritical solvent according to the fourth embodiment can be selected from the group consisting of carbon dioxide, oxygen, argon, krypton, xenon, ammonia, methane, methanol, dimethyl ketone, a hydrogen forming gas, sulfur hexafluoride, and mixtures thereof.

The supercritical solvent can be at a temperature of from about 20° C. to about 150° C. The temperature of the semiconductor substrate can be from about 20° C. to about 450° C.

The method according to the fourth embodiment can be carried out in a vessel which is pressurized from about 1000 psi to about 7000 psi.

DETAILED DESCRIPTION

Various embodiments disclosed herein are directed to depositing a material on a substrate surface such as a semiconductor substrate. The methods and compositions disclosed herein include the use of chemical fluid deposition ("CFD") using supercritical solvents.

The term "elemental metal M(0)" or "M(0)", as used herein, refers to one or more metals in their elemental form having a formal oxidation state which equals zero (0).

The term "formal oxidation state", as used herein, refers to the hypothetical charge on a metal in a metal precursor based on generally accepted electron counting theory.

"Thermodynamically favored oxidation state" of the metal, as used herein, refers to the metal in the metal precursor having a substantially stable valence shell electron configuration. For example, a thermodynamically favored oxidation state of Ta is +5.

"Thermodynamically disfavored oxidation state" of the metal or "less thermodynamically favored", as used herein, refers to the metal in the metal precursor having a substantially unstable valence shell electron configuration. For example, oxidation states of Ta that are not thermodynamically favored include oxidation states of four (IV), three (III), two (II), one (I).

"Neutral labile ligands", as used herein, include (1) chemical moieties or molecules that can easily associate and disassociate from a metal and have a neutral charge so that there is no increase in the formal oxidation state of the metal upon association with the metal, and (2) sources of the chemical moieties or molecules described in (1).

According to an embodiment, a composition for forming and depositing M(0) films on semiconductor substrates is disclosed. The composition comprising: at least one metal precursor; neutral labile ligands; and at least one supercritical solvent.

According to another embodiment, a composition for forming and depositing M(0) films on semiconductor substrates is disclosed. The composition comprising: at least one metal precursor, wherein the metal in the metal precursor has a first oxidation state which is a thermodynamically favored oxidation state of the metal; at least one reactive agent which reacts with the at least one metal precursor forming a reacted metal precursor, wherein the metal in the reacted metal precursor has a second oxidation state, and wherein the second oxidation state is lower than the first oxidation state and is less thermodynamically favored; neutral labile ligands; and at least one supercritical solvent.

The compositions can further comprise a reducing agent and/or a co-solvent. The compositions can be surfactant-free.

In some embodiments, the reducing agent can be the same as the reactive agent.

The metal precursor can be present in a range of from about 0.001 to about 20% by weight, the neutral labile ligands are present in a range of from about 0.001% to about 90% by weight, and the supercritical solvent is present in a range of from about 10% to about 99.9% by weight.

The metal precursor can comprise metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, and mercury. The metal precursor can more preferably comprise metals selected from the group consisting of titanium, zirconium, vanadium, tantalum, hafnium, chromium, molybdenum, tungsten, manganese, iron, cobalt, nickel, palladium, platinum, copper, silver, gold, zinc, cadmium, and mercury. The metal precursor can most preferably comprise metals selected from the group consisting of tantalum hafnium, zirconium, titanium, tungsten, molybdenum, and chromium.

According to preferred embodiments, neutral labile ligands can be selected from the group consisting of ethers, nitriles, thioethers, alkenes, alkynes, acyclic dienes, aromatics, ketones, amines, phosphines, isocyanides, isonitriles, CO, dinitrogen, and mixtures thereof.

According to more preferred embodiments, the neutral labile ligands can be selected from the group consisting of CO, acetonitrile, tetrahydrofuran, ethyl ether, triethylamine, triphenyl phosphine, ethylene, butadiene, 4-heptanone, and mixtures thereof.

Additional examples of neutral labile ligands are disclosed in "Principles and Applications of Organotransition Metal Chemistry", J. P. Collman, L. S. Hegedus, J. R. Norton, R. G. Finke; University Science Books; 1987, pp 24-29.

The supercritical solvent can be selected from the group consisting of carbon dioxide, oxygen, argon, krypton, xenon, ammonia, methane, methanol, dimethyl ketone, a hydrogen forming gas, sulfur hexafluoride, and mixtures thereof.

The reducing agent can be selected from the group consisting of zinc, magnesium, cadmium, mercury, sodium, potassium, lithium, boron, aluminum, and alloys thereof. In other embodiments, the reducing agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reducing agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reducing agent can be hydrogen.

Co-solvents can be useful in the deposition composition and can be of any suitable type. Illustrative species include, but are not limited to, methanol, ethanol, and higher alcohols, N-alkylpyrrolidones or N-arylpyrrolidones, such as N-methyl-, N-octyl-, or N-phenyl-pyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, and propylene carbonate.

Additional examples of the co-solvent include hydrofluorocarbons, hydrofluoroethers, sulfur hexafluoride, propane, butane, pentane, hexane, methane, dimethylformamide, N-methylpyrrolidone, diethyl ether, acetone, isopropyl alcohol, and/or dimethylsulfoxide.

A preferred deposition composition is surfactant-free. Optionally, surfactants can be added to the deposition compositions. The surfactants can be selected from the group consisting of anionic, neutral, cationic, and zwitterionic surfactants. Preferably the surfactants can be selected from the group consisting of acetylenic alcohols and diols, long alkyl chain secondary and tertiary amines, and their respective fluorinated analogs.

Additional examples of surfactants can include quaternary ammonium salts and phosphate esters, triblock copolymers of polyethylene, polypropylene, polyalkyloxide materials, triblock neutral surfactants, and/or polyoxyethylene alkyl ethers.

Although carbon dioxide is the preferred supercritical solvent in the embodiments described above, any other suitable supercritical solvent can be used to perform the same functions as carbon dioxide. Other supercritical solvents that can be used in the embodiments described above include any solvent that is in supercritical form and can penetrate the openings such as via, trenches, etc., of semiconductor substrates. Preferably, the supercritical solvent is substantially non-polar and has a substantially negligible surface tension.

Additional details regarding suitable supercritical solvents are disclosed in, for example, commonly assigned U.S. Pre-Grant Publication Number 2004/0187792, which is herein incorporated by reference in entirety.

According to further embodiments, methods for the deposition of metal films using the compositions described in the above embodiments are disclosed.

Early transition metal precursors such as Ta tend to be electropositive, oxophilic, and form unstable low valent complexes, wherein the metal in the metal precursor has a thermodynamically disfavored oxidation state. Any empty coordination sites that become available on the metal in the metal precursor during the deposition in supercritical fluids process will tend to be rapidly filled by an anionic Lewis base ligands (i.e., oxide, halide, etc.). Binding of the metal with these anionic Lewis base ligands tends to an increase in the formal oxidation state of the metal making it substantially difficult to prepare and obtain fully reduced M(0) films.

There is a strong thermodynamic driving force to fill empty coordination sites on early transition metal precursors, and so even very low levels of oxidizing sources during the deposition process tend to result in formation of unwanted metal oxide species.

While it is theoretically possible to remove all traces of oxidizing sources from a supercritical fluid deposition process, from a practical standpoint it is difficult to successfully remove all traces of oxidizing sources. Moreover, even if it was possible to remove all traces of oxidizing sources, such removal steps can render the deposition process ineffective based on efficiency and costs.

According to various embodiments described herein is the use of neutral labile ligands that can temporarily fill empty coordination sites on metals during deposition processes. The temporary filling of these empty coordination sites can substantially eliminate oxidation of the metal thereby facilitating in the complete reduction of the metal to an M(0) film.

The neutral labile ligands fill the empty coordination sites temporarily because the bond formed between the neutral labile ligand and the metal is generally substantially weaker in comparison to the bond formed between a metal and a Lewis base ligand with a negative formal charge. As a result of the weak bond formed between the neutral labile ligand and the metal, the neutral labile ligand easily disassociates from the metal. The molar excess of neutral labile ligands promotes the rapid filling of the empty coordination sites on the metal in the metal precursor. The rapid filling of the empty coordination sites thereby promotes the maintenance of the low oxidation state of the metal which in turn promotes further reduction of the metal to its elemental M(0) form.

For the deposition of metal films in supercritical fluids, metal precursors with metals having any oxidation state can be used. The metal precursor can comprise metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, and mercury. The metal precursor can more preferably comprise metals selected from the group consisting of titanium, zirconium, vanadium, tantalum, hafnium, chromium, molybdenum, tungsten, manganese, iron, cobalt, nickel, palladium, platinum, copper, silver, gold, zinc, cadmium, and mercury. The metal precursor can most preferably comprise metals selected from the group consisting of tantalum hafnium, zirconium, titanium, tungsten, molybdenum, and chromium.

Early transition metals can be oxophilic and electropositive and can form thermodynamically stable complexes with higher formal oxidation states. In contrast, synthesis, storage, and manipulation of metal precursors comprising electropositive metals having low formal oxidation states can be very challenging.

According to one embodiment, a method for depositing an elemental metal M(0) film on a semiconductor substrate is disclosed. The method comprising: heating the semiconductor substrate to obtain a heated semiconductor substrate; exposing the heated semiconductor substrate to a composition containing at least one metal precursor, an excess amount of neutral labile ligands, and a supercritical solvent; exposing the metal precursor to a reducing agent and/or thermal energy at or near the heated semiconductor substrate; reducing the metal precursor to the elemental metal M(0) by using the reducing agent and/or the thermal energy; and depositing the elemental metal M(0) film while minimizing formation of metal oxides.

The neutral labile ligands used in the above process, as described herein above, temporarily fill coordination sites on the metal in the metal precursor as they become available such that these empty coordination sites are not filled with anionic Lewis base ligands that can increase the oxidation state of the metal.

Moreover, the neutral labile ligands, described herein above, are soluble in the supercritical solvent and can be added in a large molar excess such that they are kinetically favored to fill any empty coordination sites on the low valent metal precursor when it becomes available. The neutral labile ligands can be present in a ratio of at least about 10:1 of moles of neutral labile ligands to moles of the metal precursor, more preferably the neutral labile ligands can be present in a ratio of at least about 100:1 of moles of neutral labile ligands to moles of the metal precursor, and most preferably the neutral labile ligands can be present in a ratio of at least about 1000:1 of moles of neutral labile ligands to moles of the metal precursor.

The molar excess of neutral labile ligands promotes the rapid filling of the empty coordination sites on the metal in the metal precursor. The rapid filling of the empty coordination sites thereby promotes the maintenance of the low oxidation state of the metal which in turn promotes further reduction of the metal to its elemental M(0) form.

The reducing agent can be selected from the group consisting of zinc, magnesium, cadmium, mercury, sodium, potassium, lithium, boron, aluminum, and alloys thereof. In other embodiments, the reducing agent can be selected from the group consisting of hydrogen, alcohols, formaldehyde, silanes, thiols, amines, phosphines, alkenes, dienes, ketones, diketones, heterocyclics, and mixtures thereof. In yet other embodiments, the reducing agent can be selected from the group consisting of lithium aluminum hydride, sodium borohydride, potassium ferricyanide, sodium naphthalenide, lithium amines, calcium hydride, Fe(II) complexes, cobaltocene, organoboranes, and mixtures thereof. In preferred embodiments, the reducing agent can be hydrogen.

In some embodiments, the reducing agent can be the same as the reactive agent.

The supercritical solvent in the above-described process can be at a temperature of from about 20° C. to about 150° C. The temperature of the semiconductor substrate can be from about 20° C. to about 450° C. Further, the pressure in the above-described process can be from about 1000 psi to about 7000 psi.

According to another embodiment, a method for depositing an elemental metal M(0) film on a semiconductor substrate is disclosed. The method comprising: exposing a first metal precursor to a reactive agent in the presence of a supercritical solvent containing an excess amount of neutral labile ligands, wherein the metal in the first metal precursor has a first oxidation state, wherein the first oxidation state is a thermodynamically favored oxidation state of the metal; forming in-situ a second metal precursor, wherein the metal in the second metal precursor has a second oxidation state, and wherein the second oxidation state is lower than the first oxidation state and is less thermodynamically favored; exposing the in-situ formed second metal precursor to a reducing agent and/or thermal energy; reducing the in-situ formed second metal precursor to the elemental metal M(0); and depositing the elemental metal M(0) film on a semiconductor substrate while minimizing formation of metal oxides.

The composition in the above process can further comprise (i) at least one reducing agent, (ii) at least one co-solvent, and/or (iii) at least one acid scavenger.

In some embodiments, the reducing agent can be the same as the reactive agent. In preferred embodiments, the reducing agent can be hydrogen.

The acid scavenger can be selected from the group consisting of pyridine, pyridine derivatives, heterocyclic compounds, amines, alkenes, silanes, carboxylate salts, lead salts, lead oxides, magnesium oxides, aluminum oxides, zinc oxides, hydrotalcites, and mixtures thereof. In some embodiments, the acid scavenger can be selected from the group consisting of pyridine, alkyl substituted pyridines, and mixtures thereof. In preferred embodiments, the acid scavenger can be selected from the group consisting of pyridine, C1-C6 alkyl substituted pyridine derivatives, and mixtures thereof.

A metal precursor that is easy to prepare, store and manipulate because of its thermodynamically stable oxidation state is used as the starting material in the above process. The reactive agent, reducing agent, and neutral labile ligands can be used to generate the unstable low oxidation state metal precursor in situ prior to reduction to M(0) film. For example, exposure of the Ta(V) complex CpTaCl$_4$ to CO in the presence of a Zn/Mg mixture results in the formation of the Ta(I) species CpTa(CO)$_4$. The in-situ formed Ta(I) complex can then be used to form the desired Ta(0) film through further reaction with the reducing agent and/or heat. One of the advantages of this method is that the unstable Ta(I) complex is formed in-situ and does not need to be handled or stored. In this case, the stable Ta(V) species is used to generate the fully reduced Ta(0) film.

One of the advantages of this method is that more thermodynamically stable, higher valent species of electropositive early transition metals can be prepared, stored, and handled with increased convenience and efficiency. The relatively unstable low oxidation state complexes of these electropositive metals are only generated in-situ immediately prior to formation of M(0) films.

The supercritical solvent in the above-described processes can be at a temperature of from about 20° C. to about 150° C. The temperature of the semiconductor substrate can be from about 20° C. to about 450° C.

Further, the pressure in the above-described processes can be maintained from about 1000 psi to about 7000 psi.

For example, a stable complex such as CPM(Cl)$_4$, where M is Ta or Nb, can be converted to the low valent CpM(CO)$_4$ in the presence of CO and Zn/Mg reactive agents, along with pyridine as an acid scavenger.

By using SCF-based deposition compositions, the precursor component(s) can be continuously circulated in a single wafer processing chamber to thereby expose the SCF-based deposition composition to the heated substrate, and deposit the desired M(0) film deriving from the precursor component(s) on the substrate surface. Concurrently, by-products of the deposition operation can be continuously carried out of the deposition chamber via continuous flow of the SCF-based composition through the deposition chamber containing the heated pedestal and substrate.

Alternatively, the deposition using the SCF-based deposition composition may be carried out in a batch mode, wherein the deposition composition is contacted with the substrate, and process condition(s) (e.g., temperature and/or pressure) of the composition are altered to effect the deposition of the desired material deriving from the composition.

According to an embodiment, supercritical solvent-assisted deposition of a metal film having a thickness of up to about 1 μm on a substrate such as a semiconductor wafer substrate can be carried out.

In some embodiments, the elemental metal M(0) film can comprise one or more elemental metals. In other embodiments, one or more layers of the elemental metal M(0) film can be deposited.

Deposition using the SCF-based deposition compositions can be carried out in any suitable manner, including CVD, and other techniques of application of the deposition composition on the semiconductor substrate.

The above-described processes are useful for processing semiconductor wafers of any size and can be carried out as a single wafer or batch process.

The equipment that can be used in the above-described processes can be any traditionally used equipment for single wafer processing so long as the equipment can withstand supercritical conditions. See, for example, U.S. Pat. Nos. 6,561,220, 6,736,149, and 6,486,078, herein incorporated by reference.

Plasma etching can be performed upstream or downstream of the above-described processes. Plasma etching can be performed in various types of plasma reactors using various types of etch gas chemistries. See, for example, commonly assigned U.S. Pat. No. 6,893,969 titled "Use of ammonia for etching organic low-k dielectrics", No. 6,841,483 titled "Unique process chemistry for etching organic low-k materials", No. 6,620,733 titled "Use of hydrocarbon addition for the elimination of micromasking during etching of organic low-k dielectrics", and No. 6,337,277 titled "Clean chemistry low-k organic polymer etch". See also U.S. Pat. No. 6,909,195 titled "Trench etch process for low k dielectrics" and U.S. Pre-Grant Patent Publication No. 2005/0026430 titled "Selective etching of carbon-doped low-k dielectrics" for an exemplary description of the plasma etching process.

Photoresist ashing can be performed in various types of plasma chambers using various photoresist stripping gas chemistries. The photoresist ashing process is often referred to as a "dry" "cleaning" step. See, for example, commonly assigned U.S. Pat. No. 6,949,411 titled "Method for post-etch and strip residue removal on coral films" and No. 6,777,344 titled "Post-etch photoresist strip with O$_2$ and NH$_3$ for organosilicate glass low-K dielectric etch applications". See also U.S. Pre-Grant Patent Publication No. 2005/0230351 titled "Plasma processing method and apparatus" and U.S. Pat. No. 6,323,121 titled "Fully dry post-via-etch cleaning method for a damascene process" for an exemplary description of the photoresist ashing process.

A general cleaning process can be performed upstream or downstream of the above-described metal deposition processes. See, for example, commonly assigned U.S. Pat. No. 6,277,203 titled "Method and apparatus for cleaning low K dielectric and metal wafer surfaces". See also U.S. Pre-Grant Patent Publication No. 2005/0279381 titled "Method for cleaning microstructure" and U.S. Pat. No. 6,457,477 titled "Method of cleaning a copper/porous low-k dual damascene etch" for an exemplary description of the general cleaning process.

A barrier layer deposition process can be performed upstream or downstream of the above-described metal deposition processes. See, for example, U.S. Pre-Grant Patent Publication No. 2006/0102895 titled "Precursor compositions for forming tantalum-containing films, and tantalum-containing barrier films and copper-metallized semiconductor device structures" and U.S. Pat. No. 7,049,226 titled "Integration of ALD tantalum nitride for copper metallization" for an exemplary description of the barrier layer deposition process.

Example

A silicon wafer substrate containing a Pd/Au sputter coating on a PVD ruthenium layer and thermal oxide is placed on a heated support in a high pressure chamber, along with about 45 mg of CpTa(CO)$_4$ and about 5 mg of Pd(hfac)$_2$. The chamber is flushed with carbon dioxide gas at about 400 psi for about 5 minutes, then vented down to less than about 5 psi. After the carbon dioxide flush, CO at about 500 psi is added to the chamber, followed by carbon dioxide to raise the pressure to about 2200 psi at about 61° C. After a period of about 30 minutes to ensure complete dissolution of the Ta and Pd precursors, hydrogen at about 500 psi is added to the chamber so that the total chamber pressure is about 2680 psi at about 63° C. About 2-10 minutes after completing the addition of hydrogen, the wafer substrate heater is set to about 350° C. to initiate deposition of Ta on the Pd seeded surface. The substrate heater is turned off after about twenty minutes, the chamber is flushed with copious amounts of pure carbon dioxide at about 3500 psi, then vented to ambient conditions. The wafer is removed from the chamber.

All of the above-mentioned references are herein incorporated by reference in their entirety to the same extent as if each individual reference was specifically and individually indicated to be incorporated herein by reference in its entirety.

While the invention has been described with reference to preferred embodiments, it is to be understood that variations and modifications may be resorted to as will be apparent to those skilled in the art. Such variations and modifications are to be considered within the purview and scope of the invention as defined by the claims appended hereto.

What is claimed is:

1. A composition for forming and depositing M(0) films on semiconductor substrates, the composition comprising at least one supercritical solvent to which has been added:
   at least one metal precursor;
   neutral labile ligands; and
   at least one reducing agent,
   wherein (i) the reducing agent is selected from the group consisting of zinc, magnesium, cadmium, mercury, sodium, potassium, lithium, aluminum, and alloys thereof, (ii) the reducing agent is selected from the group consisting of thiols, phosphines, and mixtures thereof, and/or (iii) the reducing agent is selected from the group consisting of sodium naphthalenide, lithium amines, Fe(II) complexes, cobaltocene, and mixtures thereof.

2. The composition of claim 1, further comprising at least one co-solvent.

3. The composition of claim 2, wherein (i) the co-solvent is selected from the group consisting of alcohols, ketones, amines, esters, ethers, lactones, carbonates, alkanes, arenes, heterocyclics, amides, and mixtures thereof, and/or (ii) the co-solvent is selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof.

4. The composition of claim 1, wherein (i) the metal precursor is present in a range of from about 0.001 to about 20% by weight, (ii) the supercritical solvent is present in a range of from about 10% to about 99.9% by weight, (iii) the composition is surfactant-free, (iv) the metal precursor comprises transition metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, mercury, and mixtures thereof, (v) the metal precursor comprises transition metals selected from the group consisting of titanium, zirconium, hafnium, vanadium, tantalum, chromium, molybdenum, tungsten, manganese, iron, cobalt, nickel, palladium, platinum, copper, silver, gold, zinc, cadmium, mercury, and mixtures thereof, (vi) the metal precursor comprises transition metals selected from the group consisting of tantalum, hafnium, zirconium, titanium, tungsten, molybdenum, chromium, and mixtures thereof, (vii) the neutral labile ligands are present in a ratio of at least about 10:1 of moles of neutral labile ligands to moles of the metal precursor, (viii) the neutral labile ligands are present in a ratio of at least about 100:1 of moles of neutral labile ligands to moles of the metal precursor, (ix) the neutral labile ligands are present in a ratio of at least about 1000:1 of moles of neutral labile ligands to moles of the metal precursor, (x) the neutral labile ligands are selected from the group consisting of ethers, nitriles, thioethers, alkenes, alkynes, acyclic dienes, arenes, aromatics, ketones, amines, phosphines, isocyanides, isonitriles, carbon monoxide, dinitrogen, and mixtures thereof, (xi) the neutral labile ligands are selected from the group consisting of carbon monoxide, acetonitrile, tetrahydrofuran, ethyl ether, triethylamine, triphenyl phosphine, ethylene, butadiene, 4-heptanone, and mixtures thereof, (xii) the neutral labile ligands are selected from the group consisting of carbon monoxide, acetonitrile, tetrahydrofuran, ether, and mixtures thereof, (xiii) the supercritical solvent is selected from the group consisting of carbon dioxide, oxygen, argon, krypton, xenon, ammonia, methane, methanol, dimethyl ketone, a hydrogen forming gas, sulfur hexafluoride, and mixtures thereof, (xiv) the metal in the metal precursor has an oxidation state that is lower than the thermodynamically favored oxidation state of the metal, (xv) the elemental metal M(0) film comprises one or more elemental metals, or (xvii) one or more layers of the elemental metal M(0) film are deposited.

5. A composition for forming and depositing M(0) films on semiconductor substrates, the composition comprising at least one supercritical solvent to which has been added:
   at least one metal precursor, wherein the metal in the metal precursor has a first oxidation state which is a thermodynamically favored oxidation state of the metal;
   at least one reactive agent which reacts with the at least one metal precursor forming a reacted metal precursor, wherein the metal in the reacted metal precursor has a second oxidation state, and wherein the second oxidation state is lower than the first oxidation state and is less thermodynamically favored;
   neutral labile ligands; and
   at least one acid scavenger,
   wherein (i) the acid scavenger is selected from the group consisting of pyridine derivatives, silanes, carboxylate salts, lead salts, lead oxides, magnesium oxides, aluminum oxides, zinc oxides, hydrotalcites, and mixtures thereof, (ii) the acid scavenger is selected from the group consisting of alkyl substituted pyridines, and mixtures thereof, and/or (iii) the acid scavenger is selected from the group consisting of C1-C6 alkyl substituted pyridine derivatives, and mixtures thereof.

6. The composition of claim 5, further comprising (i) at least one reducing agent, and/or (ii) at least one co-solvent.

7. The composition of claim 6, wherein (i) the reducing agent is selected from the group consisting of zinc, magnesium, cadmium, mercury, sodium, potassium, lithium, boron, aluminum, and alloys thereof, (ii) the reducing agent is selected from the group consisting of hydrogen, alcohols, formaldehyde, silanes, thiols, amines, phosphines, alkenes, dienes, ketones, diketones, heterocyclics, and mixtures thereof, (iii) the reducing agent is selected from the group consisting of lithium aluminum hydride, sodium borohydride, sodium naphthalenide, lithium amines, calcium hydride, Fe(II) complexes, cobaltocene, organoboranes, and mixtures thereof, (iv) the reducing agent is hydrogen, (v) the reducing agent is the same as the reactive agent, (vi) the co-solvent is selected from the group consisting of alcohols, ketones, amines, esters, ethers, lactones, carbonates, alkanes, arenes, heterocyclics, amides, and mixtures thereof, and/or (vii) the co-solvent is selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof.

8. The composition of claim 5, wherein (i) the metal precursor is present in a range of from about 0.001 to about 20% by weight, (ii) the supercritical solvent is present in a range of from about 10% to about 99.9% by weight, (iii) the composition is surfactant-free, (iv) the metal precursor comprises transition metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, mercury, and mixtures thereof, (v) the metal precursor comprises transition metals selected from the group consisting of titanium, zirconium, hafnium, vanadium, tantalum, chromium, molybdenum, tungsten, manganese, iron, cobalt, nickel, palladium, platinum, copper, silver, gold, zinc, cadmium, mercury, and mixtures thereof, (vi) the metal precursor comprises transition metals selected from the group consisting of tantalum, hafnium, zirconium, titanium, tungsten, molybdenum, chromium, and mixtures thereof, (vii) the neutral labile ligands are present in a ratio of at least about 10:1 of moles of neutral labile ligands to moles of the metal precursor, (viii) the neutral labile ligands are present in a ratio of at least about 100:1 of moles of neutral labile ligands to moles of the metal precursor, (ix) the neutral labile ligands are present in a ratio of at least about 1000:1 of moles of neutral labile ligands to moles of the metal precursor, (x) the neutral labile ligands are selected from the group consisting of ethers, nitriles, thioethers, alkenes, alkynes, acyclic dienes, arenes, aromatics, ketones, amines, phosphines, isocyanides, isonitriles, carbon monoxide, dinitrogen, and mixtures thereof, (xi) the neutral labile ligands are selected from the group consisting of carbon monoxide, acetonitrile, tetrahydrofuran, ethyl ether, triethylamine, triphenyl phosphine, ethylene, butadiene, 4-heptanone, and mixtures thereof, (xii) the neutral labile ligands are selected from the group consisting of carbon monoxide, acetonitrile, tetrahydrofuran, ether, and mixtures thereof, or (xiii) the supercritical solvent is selected from the group consisting of carbon dioxide, oxygen, argon, krypton, xenon, ammonia, methane, methanol, dimethyl ketone, a hydrogen forming gas, sulfur hexafluoride, and mixtures thereof.

9. The composition of claim 5, wherein (i) the reactive agent is selected from the group consisting of zinc, magnesium, cadmium, mercury, sodium, potassium, lithium, aluminum, and alloys thereof, (ii) the reactive agent is selected from the group consisting of hydrogen, alcohols, formaldehyde, silanes, thiols, amines, phosphines, alkenes, dienes, ketones, diketones, heterocyclics, and mixtures thereof, (iii) the reactive agent is selected from the group consisting of lithium aluminum hydride, sodium borohydride, sodium naphthalenide, lithium amines, calcium hydride, Fe(II) complexes, cobaltocene, organoboranes, and mixtures thereof, (iv) the reactive agent is hydrogen, (v) the elemental metal M(0) film comprises one or more elemental metals, and/or (vi) one or more layers of the elemental metal M(0) film are deposited.

10. A method for depositing an elemental metal M(0) film on a semiconductor substrate comprising:
heating the semiconductor substrate to obtain a heated semiconductor substrate;
exposing the heated semiconductor substrate to a composition containing at least one metal precursor, an excess amount of neutral labile ligands, and a supercritical solvent;
exposing the metal precursor to a reducing agent at or near the heated semiconductor substrate;
reducing the metal precursor to the elemental metal M(0) by using the reducing agent; and
depositing the elemental metal M(0) film while minimizing formation of metal oxides,
wherein (i) the reducing agent is selected from the group consisting of zinc, magnesium, cadmium, mercury, sodium, potassium, lithium, aluminum, and alloys thereof, (ii) the reducing agent is selected from the group consisting of thiols, phosphines, and mixtures thereof, and/or (iii) the reducing agent is selected from the group consisting of sodium naphthalenide, lithium amines, Fe(II) complexes, cobaltocene, and mixtures thereof.

11. The method of claim 10, wherein the composition further comprises at least one co-solvent.

12. The method of claim 11, wherein (i) the co-solvent is selected from the group consisting of alcohols, ketones, amines, esters, ethers, lactones, carbonates, alkanes, arenes, heterocyclics, amides, and mixtures thereof, and/or (ii) the co-solvent is selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof.

13. The method of claim 10, wherein (i) the metal precursor is present in a range of from about 0.001 to about 20% by weight, (ii) the supercritical solvent is present in a range of from about 10% to about 99.9% by weight, (iii) the composition is surfactant-free, (iv) the metal precursor comprises transition metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, mercury, and mixtures thereof, (v) the metal precursor comprises transition metals selected from the group consisting of titanium, zirconium, hafnium, vanadium, tantalum, chromium, molybdenum, tungsten, manganese, iron, cobalt, nickel, palladium, platinum, copper, silver, gold, zinc, cadmium, mercury, and mixtures thereof, (vi) the metal precursor comprises transition metals selected from the group consisting of tantalum, hafnium, zirconium, titanium, tungsten, molybdenum, chromium, and mixtures thereof, (vii) the neutral labile ligands are present in a ratio of at least about 10:1 of moles of neutral labile ligands to moles of the metal precursor, (viii) the neutral labile ligands are present in a ratio of at least about 100:1 of moles of neutral labile ligands to moles of the metal precursor, (ix) the neutral labile ligands are present in a ratio of at least about 1000:1 of moles of neutral labile ligands to moles of the metal precursor, (x) the neutral labile ligands are selected from the group consisting of ethers, nitriles, thioethers, alkenes, alkynes, acyclic dienes, arenes, aromatics, ketones, amines, phosphines, isocyanides, isonitriles, carbon monoxide, dinitrogen, and mixtures thereof, (xi) the neutral labile ligands are selected from the group consisting of carbon monoxide, acetonitrile, tetrahydrofuran, ethyl ether, triethylamine, triphenyl phosphine, ethylene, butadiene, 4-heptanone, and mixtures thereof, (xii) the neutral labile ligands are selected from the group consisting of carbon monoxide, acetonitrile, tetrahydrofuran, ether, and mixtures thereof, (xiii) the supercritical solvent is selected from the group consisting of carbon dioxide, oxygen, argon, krypton, xenon, ammonia, methane, methanol, dimethyl ketone, a hydrogen forming gas, sulfur hexafluoride, and mixtures thereof, (xiv) the elemental metal M(0) film comprises one or more elemental metals, or (xv) one or more layers of the elemental metal M(0) film are deposited.

14. The method of claim 10, wherein (i) the supercritical solvent is at a temperature of from about 20° C. to about 150° C., (ii) the temperature of the semiconductor substrate is from about 20° C. to about 450° C., and/or (iii) the method is carried out in a vessel which is pressurized from about 1000 psi to about 7000 psi.

15. A method for depositing an elemental metal M(0) film on a semiconductor substrate comprising:
    exposing a first metal precursor to a reactive agent in the presence of a supercritical solvent containing an excess amount of neutral labile ligands, wherein the metal in the first metal precursor has a first oxidation state, wherein the first oxidation state is a thermodynamically favored oxidation state of the metal;
    forming in-situ a second metal precursor, wherein the metal in the second metal precursor has a second oxidation state, and wherein the second oxidation state is lower than the first oxidation state and is less thermodynamically favored;
    exposing the in-situ formed second metal precursor in the presence of the supercritical solvent and the neutral labile ligands to a reducing agent;
    reducing the in-situ formed second metal precursor to the elemental metal M(0); and
    depositing the elemental metal M(0) film on a semiconductor substrate while minimizing formation of metal oxides,
    wherein (i) the reducing agent is selected from the group consisting of zinc, magnesium, cadmium, mercury, sodium, potassium, lithium, aluminum, and alloys thereof, (ii) the reducing agent is selected from the group consisting of thiols, phosphines, and mixtures thereof, and/or (iii) the reducing agent is selected from the group consisting of sodium naphthalenide, lithium amines, Fe(II) complexes, cobaltocene, and mixtures thereof.

16. The method of claim 15, wherein the composition further comprises (i) at least one co-solvent, and/or (ii) at least one acid scavenger.

17. The method of claim 16, wherein (i) the co-solvent is selected from the group consisting of alcohols, ketones, amines, esters, ethers, lactones, carbonates, alkanes, arenes, heterocyclics, amides, and mixtures thereof, (ii) the co-solvent is selected from the group consisting of methanol, ethanol, N-alkylpyrrolidones, N-arylpyrrolidones, dimethylsulfoxide, sulfolane, catechol, ethyl lactate, acetone, butyl carbitol, monoethanolamine, butyrol lactone, diglycol amine, gamma-butyrolactone, butylene carbonate, ethylene carbonate, propylene carbonate, hydrofluorocarbons, hydrofluoroethers, sulfur hexafluoride, propane, butane, pentane, hexane, methane, propane, dimethylformamide, N-methylpyrrolidone, diethyl ether, acetone, isopropyl alcohol, dimethylsulfoxide, and mixtures thereof, (iii) the acid scavenger is selected from the group consisting of pyridine, pyridine derivatives, heterocyclic compounds, amines, alkenes, silanes, carboxylate salts, lead salts, lead oxides, magnesium oxides, aluminum oxides, zinc oxides, hydrotalcites, and mixtures thereof, (iv) the acid scavenger is selected from the group consisting of pyridine, alkyl substituted pyridines, and mixtures thereof, and/or (v) the acid scavenger is selected from the group consisting of pyridine, C1-C6 alkyl substituted pyridine derivatives, and mixtures thereof.

18. The method of claim 15, wherein (i) the reactive agent is selected from the group consisting of zinc, magnesium, cadmium, mercury, sodium, potassium, lithium, aluminum, and alloys thereof, (ii) the reactive agent is selected from the group consisting of hydrogen, alcohols, formaldehyde, silanes, thiols, amines, phosphines, alkenes, dienes, ketones, diketones, heterocyclics, and mixtures thereof, (iii) the reactive agent is selected from the group consisting of lithium aluminum hydride, sodium borohydride, sodium naphthalenide, lithium amines, calcium hydride, Fe(II) complexes, cobaltocene, organoboranes, and mixtures thereof, (iv) the reactive agent is hydrogen, (v) the elemental metal M(0) film comprises one or more elemental metals, and/or (vi) one or more layers of the elemental metal M(0) film are deposited.

19. The method of claim 15, wherein (i) the metal precursor is present in a range of from about 0.001 to about 20% by weight, (ii) the supercritical solvent is present in a range of from about 10% to about 99.9% by weight, (iii) the composition is surfactant-free, (iv) the metal precursor comprises transition metals selected from the group consisting of scandium, yttrium, lanthanum, actinium, titanium, zirconium, hafnium, rutherfordium, vanadium, niobium, tantalum, dubnium, chromium, molybdenum, tungsten, seaborgium, manganese, technitium, rhenium, bohrium, iron, ruthenium, osmium, hassium, cobalt, rhodium, iridium, meitnerium, nickel, palladium, platinum, darmstadtium, copper, silver, gold, zinc, cadmium, mercury, and mixtures thereof, (v) the metal precursor comprises transition metals selected from the group consisting of titanium, zirconium, hafnium, vanadium, tantalum, chromium, molybdenum, tungsten, manganese, iron, cobalt, nickel, palladium, platinum, copper, silver, gold, zinc, cadmium, mercury, and mixtures thereof, (vi) the metal precursor comprises transition metals selected from the group consisting of tantalum, hafnium, zirconium, titanium, tungsten, molybdenum, chromium, and mixtures thereof, (vii) the neutral labile ligands are present in a ratio of at least about 10:1 of moles of neutral labile ligands to moles of the metal precursor, (viii) the neutral labile ligands are present in a ratio of at least about 100:1 of moles of neutral labile ligands to moles of the metal precursor, (ix) the neutral labile ligands are present in a ratio of at least about 1000:1 of moles of neutral labile ligands to moles of the metal precursor, (x) the neutral labile ligands are selected from the group consisting of ethers, nitriles, thioethers, alkenes, alkynes, acyclic dienes, arenes, aromatics, ketones, amines, phosphines, isocyanides, isonitriles, carbon monoxide, dinitrogen, and mixtures thereof, (xi) the neutral labile ligands are selected from the group consisting of carbon monoxide, acetonitrile, tetrahydrofuran, ethyl ether, triethylamine, triphenyl phosphine, ethylene, butadiene, 4-heptanone, and mixtures thereof, (xii) the neutral labile ligands are selected from the group consisting of carbon monoxide, acetonitrile, tetrahydrofuran, ether, and mixtures thereof, or (xiii) the supercritical solvent is selected from the group consisting of carbon dioxide, oxygen, argon, krypton, xenon, ammonia, methane, methanol, dimethyl ketone, a hydrogen forming gas, sulfur hexafluoride, and mixtures thereof.

20. The method of claim 15, wherein (i) the supercritical solvent is at a temperature of from about 20° C. to about 150° C., (ii) the temperature of the semiconductor substrate is from about 20° C. to about 450° C., and/or (iii) the method is carried out in a vessel which is pressurized from about 1000 psi to about 7000 psi.

* * * * *